United States Patent
Parker

(10) Patent No.: US 6,728,913 B1
(45) Date of Patent: Apr. 27, 2004

(54) DATA RECYCLING IN MEMORY

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/513,698

(22) Filed: Feb. 25, 2000

(51) Int. Cl.[7] .......................... G11C 29/00; G11C 16/06
(52) U.S. Cl. .................. 714/723; 365/185.09
(58) Field of Search ................ 714/710, 723, 714/742, 754; 365/185.09, 185.03, 185.29, 185.33

(56) References Cited

U.S. PATENT DOCUMENTS

| | | | |
|---|---|---|---|
| 4,493,081 A | 1/1985 | Schmidt ..................... 714/754 |
| 4,612,640 A | 9/1986 | Mehrotra et al. ........... 714/766 |
| 4,958,350 A | 9/1990 | Worley, III et al. ......... 714/755 |
| 5,450,424 A | 9/1995 | Okugaki et al. ............ 714/772 |
| 5,532,962 A | * 7/1996 | Auclair et al. .............. 365/201 |
| 5,546,402 A | * 8/1996 | Niijima et al. .............. 714/710 |
| 5,606,532 A | * 2/1997 | Lambrache et al. ..... 365/238.5 |
| 5,956,352 A | 9/1999 | Tatosian et al. ............ 714/733 |
| 6,002,612 A | * 12/1999 | Noda et al. ............ 365/186.09 |
| 6,058,046 A | * 5/2000 | Imamiya et al. ......... 365/185.3 |
| 6,058,047 A | 5/2000 | Kikuchi ................. 365/185.33 |

OTHER PUBLICATIONS

Choi et al., A High Speed Programming Scheme for Multi–Level NAND Flash Memory, 1996, IEEE< p. 170–171.*

* cited by examiner

Primary Examiner—Albert Decady
Assistant Examiner—Shelly A Chase

(57) ABSTRACT

A method of programming a memory device having a plurality of pages of memory. The method includes programming the memory, monitoring the memory for defects, creating a copy of the data, erasing the old version of the data, and rewriting the data. The first page of memory is programmed with a first data set. The first page of memory is monitored for errors. During the monitoring for errors, some detected errors may be corrected. When the number of errors detected exceeds a threshold, a copy of that page of memory is created. The number of errors detected can be a fixed number a percentage of the memory, or time dependent. The copy can be created in an other page of local memory of in remote memory. Then the first page of memory is erased. Finally, the first data set rewritten.

20 Claims, 3 Drawing Sheets

DATA RECYCLING IN MEMORY

BACKGROUND

A flash cell can be a field effect transistor (FET) including a select gate, a floating gate, a drain, and a source. A cell can be read by grounding the source, and applying a voltage to a bitline connected with the drain. By applying a voltage to the wordline connected to select gate, the cell can be switched on and off.

Flash memory cells can be grouped into NAND type and NOR type circuits. NAND flash memory cells have an n cell transistors connected in series and are connected in parallel between bit lines and ground lines. NAND flash memory cells are useful in large scale integration. NOR flash memory cells include cell transistors that are connected in parallel between bit lines and ground lines. NOR flash memory cells provide high-speed operation.

Programming a cell includes trapping excess electrons in the floating gate to increase voltage. This reduces the current conducted by the memory cell when the select voltage is applied to the select gate. The memory cell is programmed when the cell current is less than a reference current and the select voltage is applied. The cell is erased when the cell current is greater than the reference current and the select voltage is applied.

Existing memory refresh circuits refresh data on a cell by cell basis or a time basis, such as hourly. Refreshing the data takes time and may not be necessary every hour, day, etc.

BRIEF SUMMARY

A method of programming a memory device having a plurality of pages of memory. The method includes programming the memory, monitoring the memory for defects, creating a copy of the data, erasing the old version of the data, and rewriting the data. The first page of memory is programmed with a first data set. The first page of memory is monitored for errors. During the monitoring for errors, some detected errors may be corrected. When the number of errors detected exceeds a threshold, a copy of that page of is created. The number of errors detected can be a fixed number a percentage of the memory, or time dependent. The copy can be created in an other page of local memory of in remote memory. Then the first page of memory is erased. Finally, the first data set rewritten.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION

Figure 1:
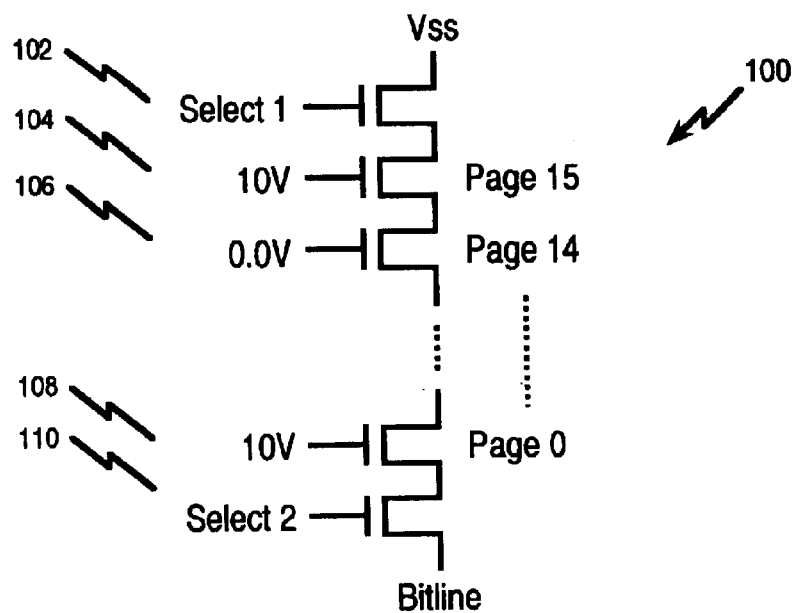
FIG. 1 is a circuit diagram of the selects for the page erase mechanism.

FIG. 1 shows a diagram of the selects for the page erase mechanism 100. The page erase mechanism 100 includes a two selects "Select 1" 102 and "Select 2" 110. These selects select which page of memory is being erased. The page erase lines 104, 106, and 108 each are connected to a separate page of memory for example page 15, 14, and 0 respectively. The page erase mechanism 100 can control more pages of memory than shown for example, 10 pages, 100 pages, or 1 million pages or more. The voltage applied to the page erase lines 104, 106, and 108 indicates which page of memory, if any, are being erased. The page of memory will be erased when the page erase line associated with it is has zero volts (0V) applied to it. The pages of memory not being erased can have 10V applied to them. The Vss applied to the bitline can be for example 20 volts.

Figure 2:
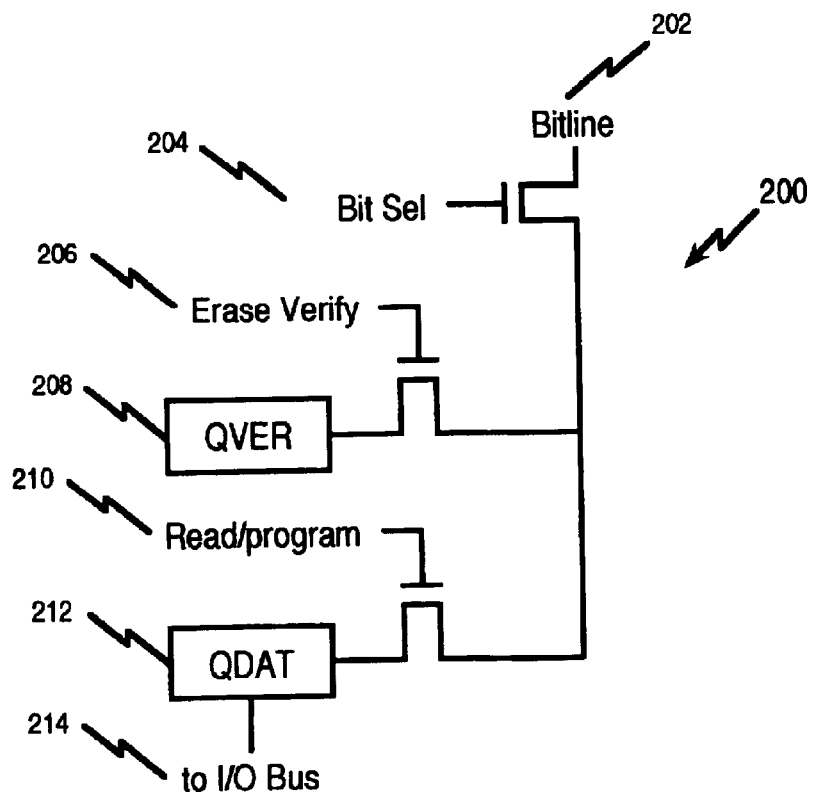
FIG. 2 is a circuit diagram of the page erase mechanism.

FIG. 2 shows a circuit diagram of the page erase mechanism 200. The page erase mechanism 200 includes a Bit Sel 204, a QVER latch 208 an erase verify control 206, a QDAT latch 212, and a read/program control 210. The output of the page erase mechanism 200 is sent to the input/output bus (I/O bus) 214.

Bit Sel 204 enables the bit line. The erase verify control 206 verifies the erase occurred. The QVER latch 208 performs erase, read, and program verify. The QVER latch 208 completes the operation the data is no longer in the QVER latch 208. The QDAT latch 208 stores the data and puts the data on the I/O bus 214 ond back to the bi line depending on which operation is being performed. QDAT is bit data storage used in the program or read operations.

The read/program circuit 210 controls whether data is being read from the memory or whether data is being programmed(written) to the memory.

A method of programming a memory device with a plurality of pages of memory includes programming, monitoring, creating a copy, erasing, and recycling. The first page of memory is programmed with a first data set. More than one page of memory can be programmed. A page of memory can be a group of memory cells, a sector of memory cells, a single cell or a plurality of memory cells such as 4096 cells. The memory cells can be non-volatile memory including non-volatile NAND flash memory. The first page of memory is monitored for errors. During monitoring for errors, some detected errors can be corrected. The error correction can include using error correction code. The errors can occur for "read disturb" or "data retention" or other sources. When a number of errors are detected, a copy of that page of memory is created in the QDAT latch 208. The number of errors detected can be a fixed number such as 1 to 100,000; it can be a percentage of the memory cells, such as 0.1% to 50%; or it can be a time dependent threshold such as an error rate per second. Then, the first page of memory is erased using the QVER latch 208. Finally, the first data set recycling. Recycling includes rewriting, restoring, or reprogramming the data in its original location. Each page of memory can be separately monitored, erase, and recycled. The QDAT Latch 208 is used to restore the corrected data.

A recyclable programmable memory device includes a memory array, a programming circuit, an error detection circuit, an erase circuit, and a recycling circuit. The memory array has at least one page of memory cells and preferably a plurality of pages of memory. The programming circuit is capable of storing data in the memory cells. The error detection circuit is capable of detecting errors in the data stored in the memory cells and optionally includes an error correction circuit. The erase circuit is capable of erasing the memory cells on a page by page basis. The erase circuit can erase the page of memory after a number of errors are detected by the error detection circuit. The number of errors can be a fixed number or a percentage of the memory cells in the page. The recycling circuit is capable of restoring the data in the memory cells after the erase circuit has erased those cells. When multiple the memory array includes multiple pages of memory, each page of memory can be monitored, erased, and recycled independently. The term "circuit" includes hardware only, combined hardware and software, and software only and is not meant to be limited to a physical or electronic circuit.

Figure 3:
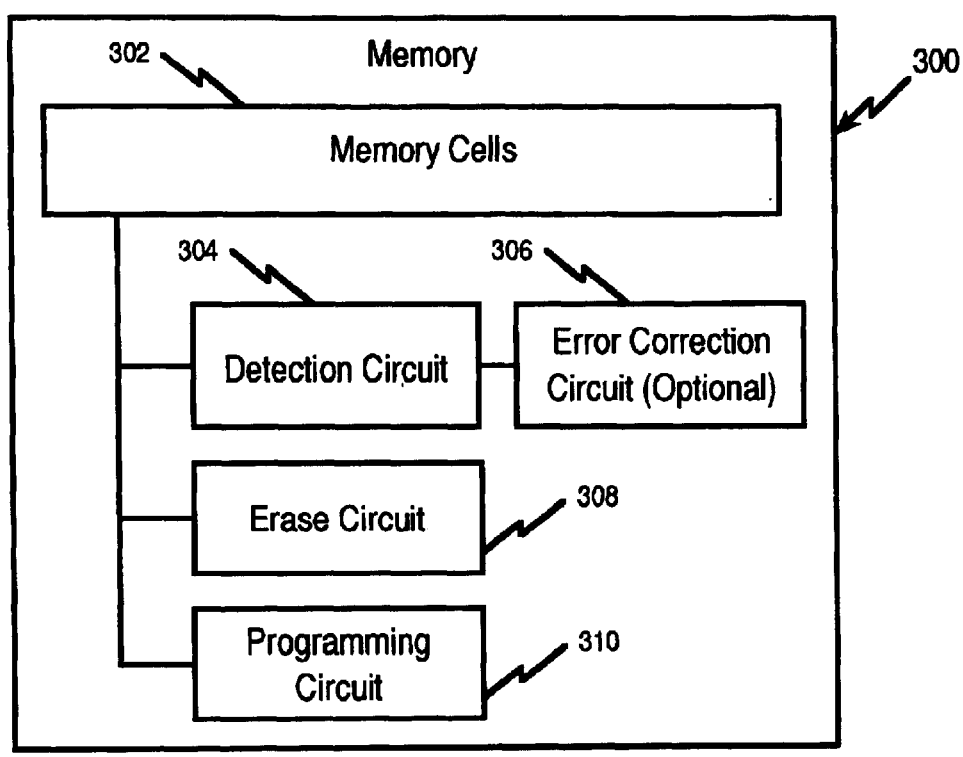
FIG. 3 is an illustration of an embodiment of a memory.

FIG. 3 is an illustration of an embodiment of a memory 300 with memory cells 302, a detection circuit 304 with optional error correction circuit, an erase circuit 308, and a programming circuit 310.

Figure 4:
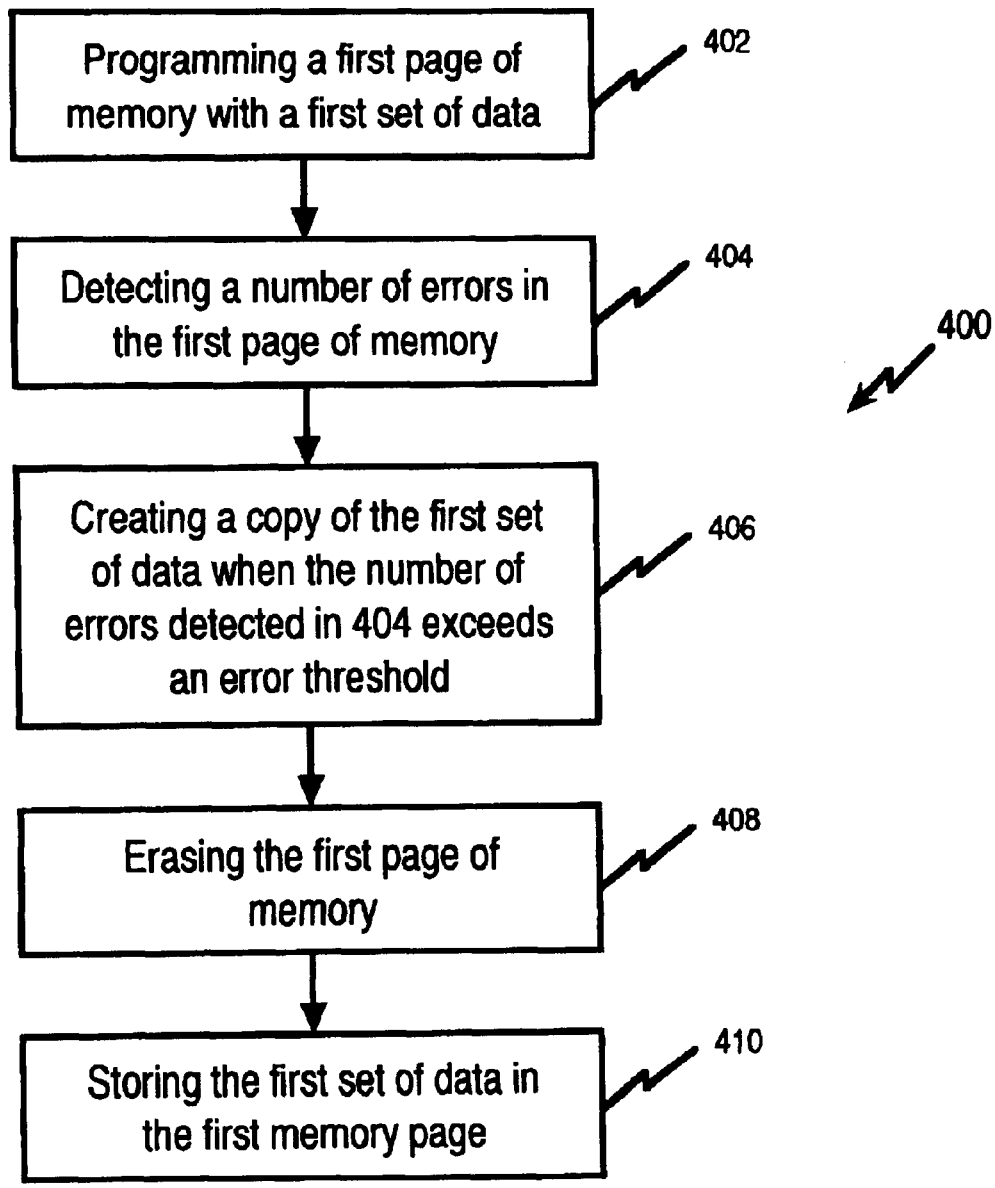
FIG. 4 is a flow diagram of a method of programming a memory with a plurality of memory pages.

FIG. 4 is a flow diagram of a method of programming memory 400 with a plurality of memory pages. In 402, a first page of memory with a first data set is programmed. In 404, a number of errors in the first page of memory are detected. In 406, a copy of the first data set when the number of errors detected in 404 exceeds an error threshold is created. In 408, the first page of memory is erased. And in 410, the first data set in the first memory page is stored.

The above described embodiments and other embodiments can be implemented in hardware, software, or a combination of hardware and software.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of programming a memory device having a plurality of memory pages, comprising:
   monitoring a memory page for errors;
   detecting a number of errors that exceeds a threshold value;
   copying data stored in said memory page into a data storage;
   erasing said memory page; and
   writing the data in said data storage into said memory page.

2. The method of claim 1, further comprising correcting said data.

3. The method of claim 2, wherein said correcting is done using an error correction code.

4. The method of claim 1, wherein said threshold value is a fixed number of errors detected.

5. The method of claim 4, wherein said fixed number is between 1 and 100,000.

6. The method of claim 1, wherein said threshold value is between 0.1 percent and 50 percent of the memory cells in said memory page.

7. The method of claim 1, wherein said threshold value is time dependent.

8. The method of claim 1, wherein said memory page comprises non-volatile memory cells.

9. The method of claim 8, wherein said memory page comprises NAND flash memory.

10. The method of claim 1, wherein said memory page is a sector of memory cells.

11. The method of claim 1, wherein said threshold value is stored in a non-volatile memory.

12. A programmable memory device comprising:
   a memory array comprising a page of memory cells;
   a programming circuit for writing data to said page of memory cells;
   a detection circuit for detecting errors in said page of memory cells;
   an erase circuit for erasing said page of memory cells;
   a data storage for holding a copy of the data in said page of memory cells; and
   a recycling circuit for writing said copy of the data into said data storage.

13. The programmable memory device of claim 12, wherein the page of memory cells includes 4096 cells.

14. The programmable memory device of claim 12, further comprising an error correction circuit.

15. The programmable memory device of claim 14, wherein said error correction circuit uses error correction codes.

16. The programmable memory device of claim 12, wherein said memory array comprises a plurality of pages of memory cells.

17. The programmable memory device of claim 12, wherein said memory array comprises NAND flash memory.

18. A computer readable medium containing executable instructions which, when executed in a processing system, causes the system to perform a method comprising:
   monitoring a memory page for errors;
   detecting a number of errors that exceeds a threshold value;
   copying data stored in said memory page into a data storage;
   erasing said memory page; and
   writing the data in said data storage into said memory page.

19. The method of claim 18, further comprising correcting said data.

20. the method of claim 19, wherein said correcting is done using an error correction code.

* * * * *